(12) United States Patent
Wang et al.

(10) Patent No.: US 11,127,798 B2
(45) Date of Patent: Sep. 21, 2021

(54) PIXEL DEFINITION LAYER AND MANUFACTURING METHOD THEREOF, DISPLAY SUBSTRATE, AND DISPLAY PANEL

(71) Applicant: BOE Technology Group Co., Ltd., Beijing (CN)

(72) Inventors: Linlin Wang, Beijing (CN); Chengyuan Luo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 274 days.

(21) Appl. No.: 16/126,053

(22) Filed: Sep. 10, 2018

(65) Prior Publication Data

US 2019/0115402 A1     Apr. 18, 2019

(30) Foreign Application Priority Data

Oct. 18, 2017 (CN) .......................... 201710978290.0

(51) Int. Cl.
*H01L 51/56* (2006.01)
*H01L 27/32* (2006.01)
*H01L 51/00* (2006.01)

(52) U.S. Cl.
CPC .......... *H01L 27/3246* (2013.01); *H01L 51/56* (2013.01); *H01L 51/0005* (2013.01); *H01L 51/0012* (2013.01)

(58) Field of Classification Search
CPC . H01L 21/3246; H01L 27/3246; H01L 51/56; H01L 51/0005; H01L 51/0012
See application file for complete search history.

(56) References Cited

U.S. PATENT DOCUMENTS

2004/0262607 A1* 12/2004 Tsujimura ......... H01L 29/78696
257/61
2009/0256474 A1  10/2009 Wang et al.
(Continued)

FOREIGN PATENT DOCUMENTS

| CN | 104167430 A | 11/2014 |
| CN | 105118845 A | 12/2015 |
| CN | 105118845 B | * 1/2018 ......... H01L 51/0005 |

OTHER PUBLICATIONS

First office action of Chinese application No. 201710978290.0 dated Jul. 31, 2019.

*Primary Examiner* — Steven B Gauthier
*Assistant Examiner* — Christopher A Culbert
(74) *Attorney, Agent, or Firm* — Fay Sharpe LLP

(57) ABSTRACT

A pixel definition layer and a manufacturing method thereof, a display substrate, and a display panel are provided. The pixel definition layer includes: a lyophilic material layer on a base substrate, which includes a plurality of lyophilic portions spaced in pairs, which being with an annular structure and used to define a pixel region; and a lyophobic material layer on a side of the lyophilic material layer from the base substrate, which being filled between each two adjacent lyophilic portions of the plurality of lyophilic portions, and a distance from a surface of the lyophobic material layer from the base substrate to the base substrate is larger than a distance from a surface of the lyophilic material layer from the base substrate to the base substrate. The pixel definition layer improves the uniformity of films formed in the pixel region by the solution.

18 Claims, 15 Drawing Sheets

(56) References Cited

U.S. PATENT DOCUMENTS

| | | | | |
|---|---|---|---|---|
| 2016/0247862 A1* | 8/2016 | Song | .................... | H01L 27/3246 |
| 2017/0005154 A1* | 1/2017 | You | ..................... | H01L 51/5253 |
| 2017/0194394 A1* | 7/2017 | Hou | .................... | H01L 51/0012 |
| 2018/0182786 A1* | 6/2018 | Zhang | ............... | H01L 21/31155 |
| 2018/0323398 A1* | 11/2018 | Zhang | ................. | H01L 51/5072 |

* cited by examiner

PIXEL DEFINITION LAYER AND MANUFACTURING METHOD THEREOF, DISPLAY SUBSTRATE, AND DISPLAY PANEL

This application claims priority to Chinese Patent Application No. 201710978290.0, filed with the State Intellectual Property Office on Oct. 18, 2017 and titled "PIXEL DEFINITION LAYER AND MANUFACTURING METHOD THEREOF, DISPLAY SUBSTRATE, AND DISPLAY PANEL", the entire contents of which are incorporated herein by reference.

TECHNICAL FIELD

The present disclosure relates to a pixel definition layer and a manufacturing method thereof, a display substrate, and a display panel.

BACKGROUND

An organic light-emitting diode (OLED) display panel includes an anode, a hole injection layer, a hole transport layer, an organic material film layer, an electron transport layer, a electron injection layer, and a cathode, etc. Herein, the organic material film layer is manufactured through ink-jet printing technology. When ink-jet printing technology is adopted to manufacture the organic material film layer, a pixel definition layer needs to be formed on a glass substrate first, and then a solution with organic light-emitting materials dissolved is sprayed on the glass substrate on which the pixel definition layer is formed, to form the organic material film layer. Herein, the pixel definition layer is used to define a plurality of pixel regions on the base substrate.

In the related art, the pixel definition layer is made of resin, and the section of the pixel definition layer is in the shape of a trapezoid in the direction perpendicular to the substrate.

There is a big difference between the surface energy of the material of the pixel definition layer and that of the solution with organic light-emitting materials dissolved. During the ink-jet printing process, the solution with organic light-emitting materials dissolved will climb to a certain extent on the side surface of the pixel definition layer, thereby affecting the uniformity of films formed by the solution within the pixel regions.

SUMMARY

There are provided a pixel definition layer and a manufacturing method thereof, a display substrate, and a display panel in embodiments of the present disclosure.

In an aspect, there is provided a pixel definition layer, comprising: a lyophilic material layer on a base substrate, the lyophilic material layer comprising a plurality of lyophilic portions spaced in pairs, each of the lyophilic portions being with an annular structure and being used to define a pixel region; and a lyophobic material layer on a side of the lyophilic material layer away from the base substrate, wherein the lyophobic material layer is filled between each two adjacent lyophilic portions of the plurality of lyophilic portions, and a distance from a surface of the lyophobic material layer away from the base substrate to the base substrate being larger than a distance from a surface of the lyophilic material layer away from the base substrate to the base substrate.

Optionally, an orthographic projection of a first surface of the lyophobic material layer on the base substrate is within an orthographic projection of the surface of the lyophilic material layer away from the base substrate on the base substrate, and the first surface is a surface of the lyophobic material layer that is in contact with the surface of the lyophilic material layer away from the base substrate.

Optionally, a surface of at least one of the plurality of lyophilic portions away from the base substrate has groove(s); and orthographic projection(s) of the groove(s) on the base substrate is within the orthographic projection of the first surface on the base substrate.

Optionally, the lyophilic material layer is made of a lyophilic material, and the lyophilic material is a conductive material.

Optionally, the lyophilic portion is with a square annular structure.

Optionally, the lyophilic material layer is made of a lyophilic material and the lyophobic material layer is made of a lyophobic material; the lyophobic material includes: fluorinated polyimide, fluorinated polymethyl methacrylate or polysiloxane; and the lyophilic material includes: silicon dioxide, silicon nitride or indium tin oxide.

Optionally, a thickness range of the lyophilic material layer is: 300 nm to 600 nm; and a thickness range of the lyophobic material layer is: 500 nm to 900 nm.

In another aspect, there is provided a manufacturing method for a pixel definition layer, comprising:

forming a lyophilic material layer using a lyophilic material on a base substrate, the lyophilic material layer comprising a plurality of lyophilic portions spaced in pairs, each of the lyophilic portions being with an annular structure and being used to define a pixel region; and forming a lyophobic material layer on a side of the lyophilic material layer away from the base substrate using a lyophobic material, the lyophobic material layer being filled between each two adjacent lyophilic portions of the plurality of lyophilic portions, and a distance from a surface of the lyophobic material layer away from the base substrate to the base substrate being larger than a distance from a surface of the lyophilic material layer away from the base substrate to the base substrate.

Optionally, an orthographic projection of a first surface of the lyophobic material layer on the base substrate is within an orthographic projection of the surface of the lyophilic material layer away from the base substrate on the base substrate, and the first surface is a surface of the lyophobic material layer that is in contact with the surface of the lyophilic material layer away from the base substrate.

Optionally, before said forming a lyophobic material layer on a side of the lyophilic material layer away from the base substrate using a lyophobic material, the method further comprises:

forming groove(s) on a surface of at least one of the plurality of lyophilic portions away from the base substrate;

orthographic projection(s) of the groove(s) on the base substrate being within the orthographic projection of the first surface on the base substrate.

Optionally, said forming groove(s) on a surface of at least one of the plurality of lyophilic portions away from the base substrate comprises:

forming the groove(s) on the surface of at least one of the plurality of lyophilic portions away from the base substrate through one of the processing ways of Light Amplification by Stimulated Emission of Radiation (laser) boring and patterning.

Optionally, a first electrode is formed on the base substrate, and said forming a lyophilic material layer using a lyophilic material on a base substrate comprises:

forming a photoresist pattern on the base substrate on which the first electrode is formed, areas not covered by the photoresist pattern on the base substrate including a plurality of annular areas formed at intervals;

forming a lyophilic material film layer using a lyophilic material on the base substrate on which the photoresist pattern is formed;

removing a preset thickness of the lyophilic material from the lyophilic material film layer to expose the photoresist pattern and obtain the lyophilic material layer; and stripping the photoresist pattern.

In yet another aspect, there is provided a display substrate, comprising: a base substrate, a pixel definition layer on the base substrate, and a first electrode between the base substrate and the pixel definition layer, wherein the pixel definition layer comprises:

a lyophilic material layer on the base substrate, wherein the lyophilic material layer comprising a plurality of lyophilic portions that are spaced in pairs, each of the lyophilic portions being with an annular structure and being used to define a pixel region; and a lyophobic material layer on a side of the lyophilic material layer away from the base substrate, the lyophobic material layer being filled between each two adjacent lyophilic portions of the plurality of lyophilic portions, and a distance from a surface of the lyophobic material layer away from the base substrate to the base substrate being larger than a distance from a surface of the lyophilic material layer away from the base substrate to the base substrate.

Optionally, the first electrode and the lyophilic material layer in the pixel definition layer are made of the same material.

Optionally, both the first electrode and the lyophilic material layer are made of indium tin oxide (ITO).

Optionally, the display substrate further comprises:

an organic light-emitting layer on a side of the first electrode away from the base substrate; and a barrier film on a side of the organic light-emitting layer away from the base substrate; and a second electrode on a side of the barrier film away from the base substrate;

wherein the barrier film is used to separate the first electrode from the second electrode.

Optionally, the distance from the surface of the lyophilic material layer away from the base substrate to the base substrate is shorter than a distance from a surface of the organic light-emitting layer away from the base substrate to the base substrate.

Optionally, materials for forming the barrier film include: molybdenum oxide, zinc oxide or titanium oxide.

Optionally, a thickness range of the barrier film is: 100 nm to 300 nm.

In a further aspect, there is provided a display panel, comprising any one of the display substrates described in the third aspect.

Optionally, the display panel further comprises: an active matrix organic light-emitting diode display panel.

DETAILED DESCRIPTION

The embodiments of the present disclosure will be described in further detail with reference to the enclosed drawings, to make the principles and advantages of the present disclosure clearer.

Methods for forming films of the organic light-emitting layer on an OLED display panel mainly include a vapor deposition process and a solution process. The vapor deposition process is widely used in small-size applications, and has been applied to mass production. The solution process mainly includes ink-jet printing, coating, spin coating, screen printing, etc. With the advantages of high material utilization ratio and large-size achievable, ink-jet printing technology has been regarded as an important method for mass production of large-size OLEDs. With the ink-jet printing technology, a pixel definition layer needs to be firstly manufactured on the base substrate on which an anode is formed, the pixel definition layer is used to define a plurality of pixel regions on the base substrate, such that the solution with organic light-emitting materials dissolved may flow into the specified R (red), G (green) and B (blue) sub-pixel regions accurately.

Figure 1:
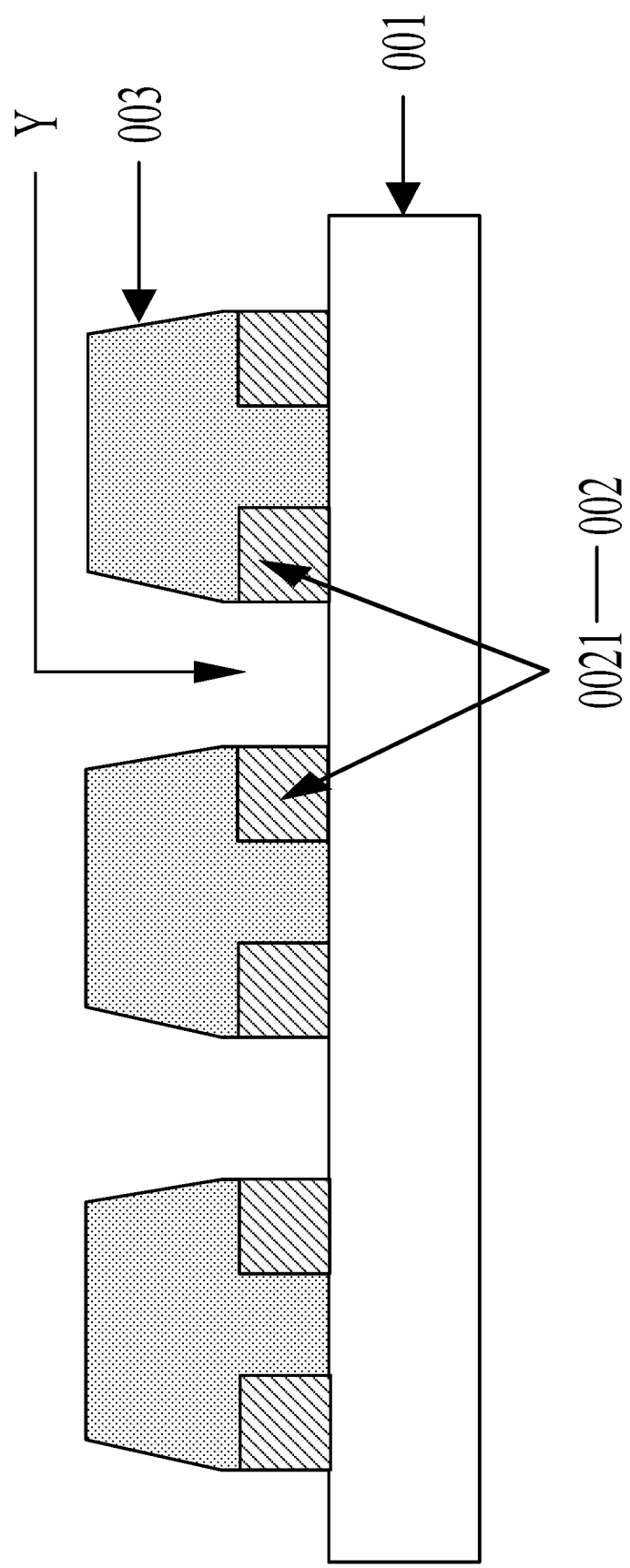
FIG. 1 is a schematic diagram of a structure of a pixel definition layer according to an embodiment of the present disclosure.

There is provided a pixel definition layer in the embodiments of the present disclosure. As shown in FIG. 1, the pixel definition layer 00 may include: a lyophilic material layer 002 on a base substrate 001, and a lyophobic material layer 003 on a side of the lyophilic material layer 002 away from the base substrate 001.

Figure 2:
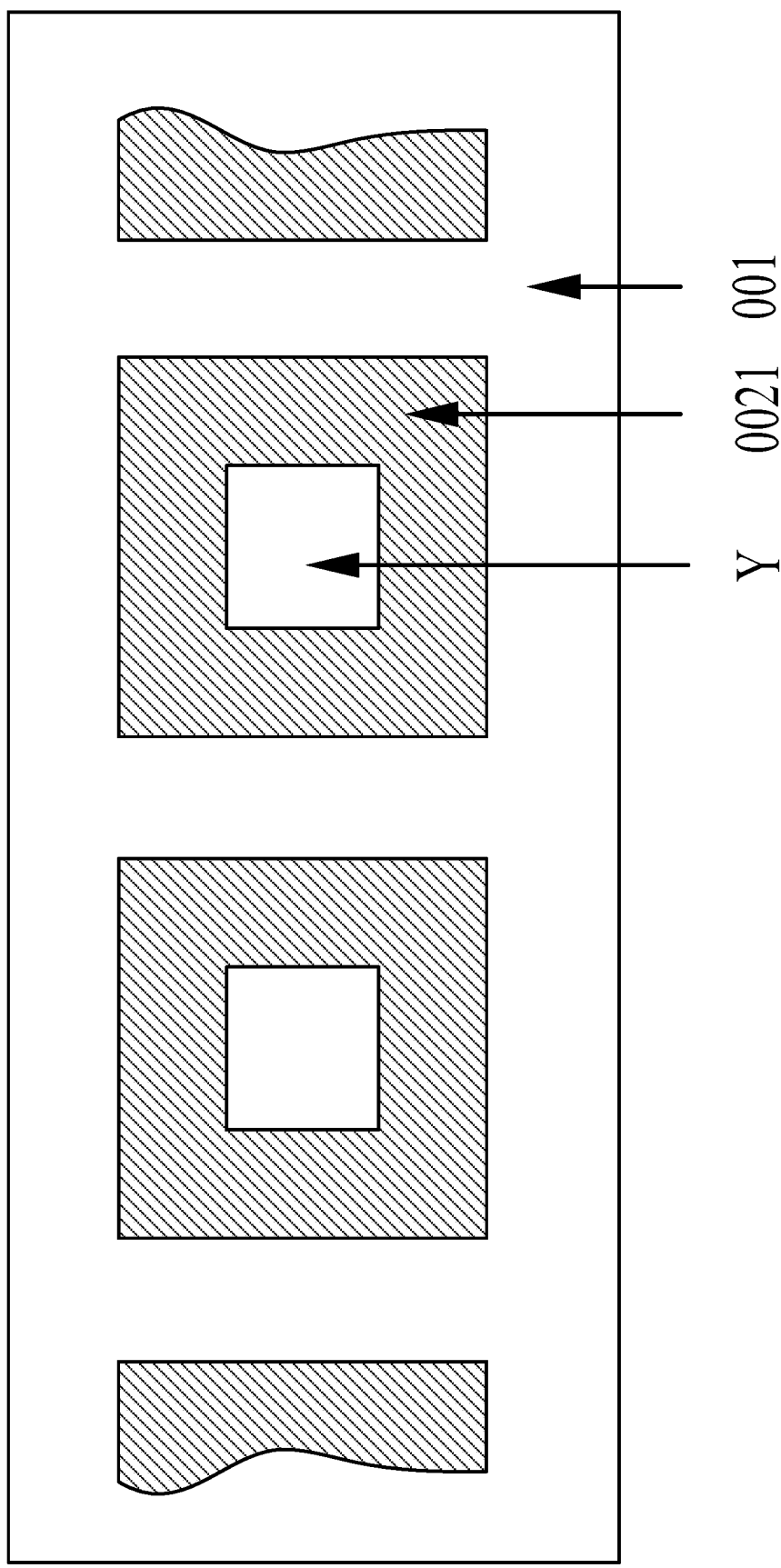
FIG. 2 is a schematic diagram of orthographic projection(s) of a plurality of lyophilic portions in a lyophilic material layer on a base substrate according to an embodiment of the present disclosure.

The lyophilic material layer 002 may include a plurality of lyophilic portions 0021 spaced in pairs. Each of the lyophilic portions 0021 is with an annular structure and is used to define a pixel region Y. Referring to FIG. 2, which shows the orthographic projection(s) of the plurality of lyophilic portions 0021 in the lyophilic material layer 002 on the base substrate, each of the lyophilic portions 0021 may be with an annular structure and is used to define a pixel region Y.

Please continue to refer to FIG. 1, the lyophobic material layer 003 may be filled between each two adjacent lyophilic portions 0021 of the plurality of lyophilic portions 0021, and the distance from the surface of the lyophobic material layer 003 away from the base substrate 001 to the base substrate 001 is larger than the distance from the surface of the lyophilic material layer 002 away from the base substrate 001 to the base substrate 001.

Herein, the lyophilic material layer 002 may be made of a lyophilic material having attractivity to the solution with organic electroluminescent materials dissolved. The lyophobic material layer 003 may be made of a lyophobic material having repellency to the solution with organic electroluminescent materials dissolved. Optionally, the lyophilic material may be a conductive material. For example, the lyophilic material may be any one of inorganic lyophilic materials, such as silicon dioxide, silicon nitride and indium tin oxide (ITO). The lyophobic material may be any one of the materials having repellency to the solution with organic electroluminescent materials dissolved, such as fluorinated polyimide, fluorinated polymethyl methacrylate and polysiloxane.

In summary, the pixel definition layer provided in the embodiments of the present disclosure includes a lyophilic material layer and a lyophobic material layer sequentially laminated on a base substrate. The distance from the surface of the lyophobic material layer away from the base substrate to the base substrate is larger than the distance from the surface of the lyophilic material layer away from the base substrate to the base substrate, thereby ensuring that the solution flows into the pixel regions by taking advantage of the attractivity of the lyophilic material layer to the solution, and restraining the solution from climbing on the pixel definition layer by taking advantage of the repellency of the lyophobic material layer to the solution. Moreover, the lyophilic material layer includes a plurality of lyophilic portions, and the lyophobic material layer be filled between each two adjacent lyophilic portions of the plurality of lyophilic portions, which ensures the stability of the structure of the pixel definition layer, thereby effectively improving the uniformity of films formed by the solution in the pixel regions.

Figure 3:
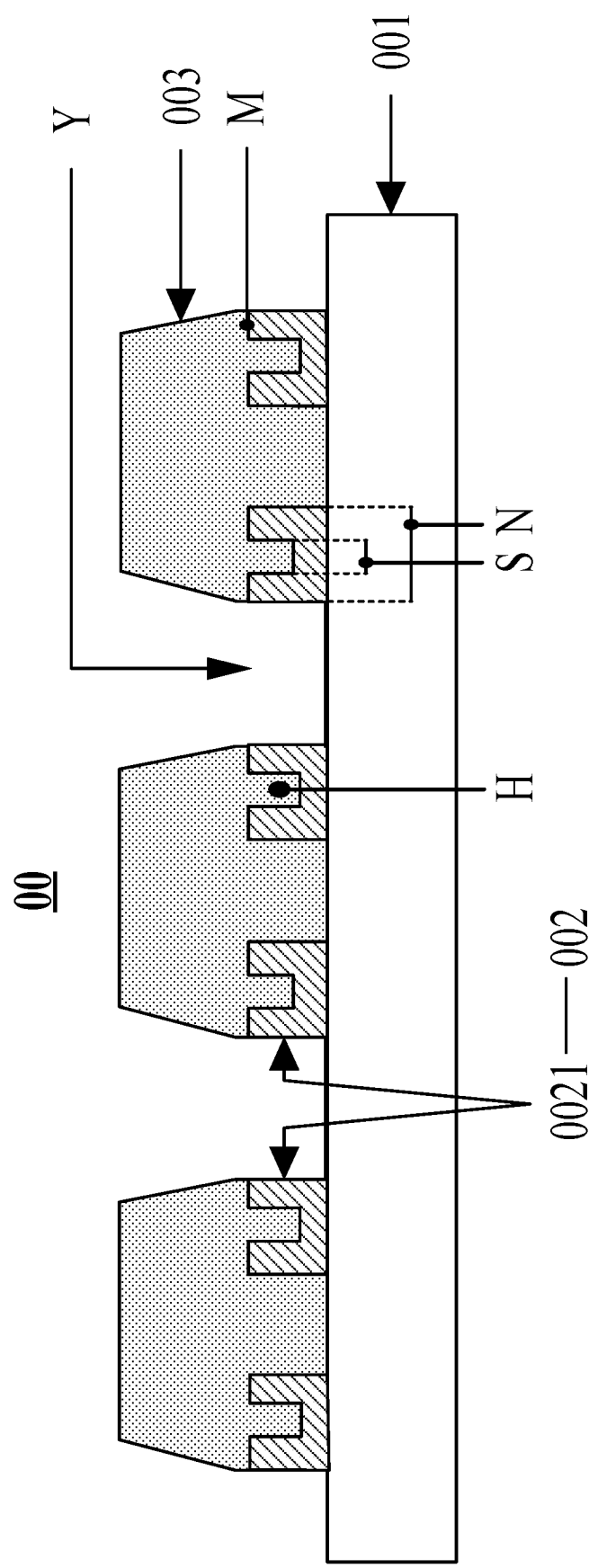
FIG. 3 is a schematic diagram of a structure of another pixel definition layer according to an embodiment of the present disclosure.

FIG. 3 shows a schematic diagram of a structure of another pixel definition layer according to an embodiment of the present disclosure. Please refer to FIG. 3, the orthographic projection of the first surface M of the lyophobic material layer 003 on the base substrate 001 may be within the orthographic projection of the surface of the lyophilic material layer 002 away from the base substrate 001 on the base substrate 001. The first surface M is a surface of the lyophobic material layer 003, and is in contact with the surface of the lyophilic material layer 002 away from the base substrate 001. When the orthographic projection of the first surface M of the lyophobic material layer 003 on the base substrate 001 is within the orthographic projection of the surface of the lyophilic material layer 002 away from the base substrate 001 on the base substrate 001, the lyophobic material layer 003 on the lyophilic material layer 002 may fully play its repellency function on the solution, to further restrain the solution from climbing on the side surface of the pixel definition layer 00. Moreover, the lyophobic material layer 003 may define pixel regions together with the lyophilic material layer 002. When an organic light-emitting layer is formed in the pixel region, the uniformity of the films of the organic light-emitting layer is better under the function of the pixel definition layer, which correspondingly ensures a trend of uniform luminance of the organic light-emitting layer formed in the pixel region, thereby improving the display effect.

It should be noted that the orthographic projection of the first surface M of the lyophobic material layer 003 on the base substrate 001 being within the orthographic projection of the surface of the lyophilic material layer 002 away from the base substrate 001 on the base substrate 001 refers to that the relationship between the first periphery of the orthographic projection of the first surface M of the lyophobic material layer 003 on the base substrate 001 and the second periphery of the orthographic projection of the surface of the lyophilic material layer 002 away from the base substrate 001 on the base substrate 001 satisfies that: the first periphery overlaps with the second periphery, or the first periphery does not overlap with the second periphery and the first periphery is within the second periphery. An orthographic projection being within another orthographic projection in the whole text refers to that the peripheries of the both satisfy the above relationship.

Please continue to refer to FIG. 3, the surface of at least one of the plurality of lyophilic portions away from the base substrate 001 may be provided with groove(s) H, and the orthographic projection(s) S of the groove(s) H on the base substrate 001 are within the orthographic projection N of the first surface of the lyophobic material layer 003 on the base substrate 001. When there is groove(s) on the surface of the lyophilic material layer 002, on the one hand, the groove(s) may play a certain limiting function on the lyophobic material formed in the groove(s) during the process of forming the lyophobic material layer 003 on the surface of the lyophilic material layer 002 away from the base substrate 001, such that the lyophobic material layer 003 may be formed at the preset position more accurately, and on the other hand, part of the lyophobic material can be formed within the groove(s) during the process of forming the lyophobic material layer 003 on the surface of the lyophilic material layer 002 away from the base substrate 001, such that part of the formed lyophobic material layer 003 is fixed in the groove(s), which may further ensure the stability of the structure of the pixel definition layer 00.

It should be noted that when the lyophilic portions are not provided with groove(s) on the surface away from the base substrate, the surface of the lyophilic portions away from the base substrate is a plane, and correspondingly the first surface of the lyophobic material layer is also a plane (ideally, the surface is a plane, but in practical application, there may be tiny bulges or dents on the surface due to process variation or other factors. In such cases, the surface may also be deemed as a plane). When the lyophilic portions have groove(s) on the surface away from the base substrate, correspondingly the first surface of the lyophobic material layer includes a plurality of bulges towards one side of the base substrate, and the positions of the bulges correspond to the positions of the grooves one by one.

In summary, the pixel definition layer provided in the embodiments of the present disclosure includes a lyophilic material layer and a lyophobic material layer sequentially laminated on a base substrate. The distance from the surface of the lyophobic material layer away from the base substrate to the base substrate is larger than the distance from the surface of the lyophilic material layer away from the base substrate to the base substrate, thereby ensuring that the solution flows into the pixel regions by taking advantage of the attractivity of the lyophilic material layer to the solution, and restraining the solution from climbing on the pixel definition layer by taking advantage of the repellency of the lyophobic material layer to the solution. Moreover, the lyophilic material layer includes a plurality of lyophilic portions, and the lyophobic material layer is filled between each two adjacent lyophilic portions of the plurality of lyophilic portions, which ensures the stability of the structure of the pixel definition layer, thereby effectively improving the uniformity of films formed by the solution in the pixel regions.

Figure 4:
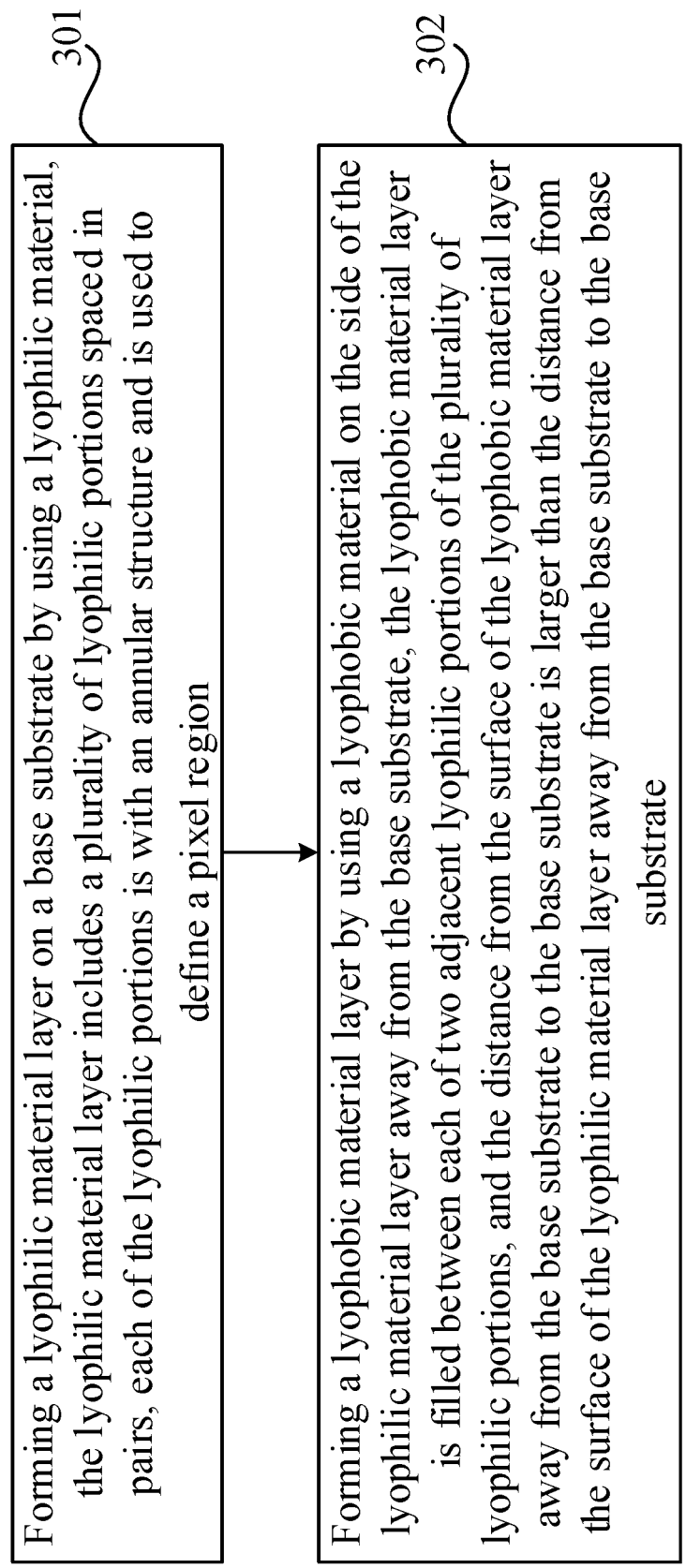
FIG. 4 is a flow chart of a manufacturing method for a pixel definition layer according to an embodiment of the present disclosure.

FIG. 4 shows a flow chart of a manufacturing method for a pixel definition layer according to an embodiment of the present disclosure. As shown in FIG. 4, the method may include following working processes.

In step 301, a lyophilic material layer is formed on a base substrate by using a lyophilic material. The lyophilic material layer may include a plurality of lyophilic portions spaced in pairs, each of the lyophilic portions is with an annular structure and is used to define a pixel region.

In step 302, a lyophobic material layer is formed by using a lyophobic material on the side of the lyophilic material layer away from the base substrate. The lyophobic material layer is filled between each of two adjacent lyophilic portions of the plurality of lyophilic portions, and the distance from the surface of the lyophobic material layer away from the base substrate to the base substrate is larger than the distance from the surface of the lyophilic material layer away from the base substrate to the base substrate.

In summary, with manufacturing method for the pixel definition layer provided in the embodiments of the present disclosure, by disposing the lyophilic material layer and the lyophobic material layer laminated on the base substrate, the distance from the surface of the lyophobic material layer away from the base substrate to the base substrate is larger than the distance from the surface of the lyophilic material layer away from the base substrate to the base substrate, thereby ensuring that the solution flows into the pixel regions by taking advantage of the attractivity of the lyophilic material layer to the solution, and restraining the solution from climbing on the pixel definition layer by taking advantage of the repellency of the lyophobic material layer to the solution. Moreover, the lyophilic material layer includes a plurality of lyophilic portions. During the process of forming the lyophobic material layer, adjacent two lyophilic portions may limit the flow range of the lyophobic material, which ensure the stability of the structure of the pixel definition layer, thereby effectively improving the uniformity of films formed by the solution in the pixel regions.

Figure 5:
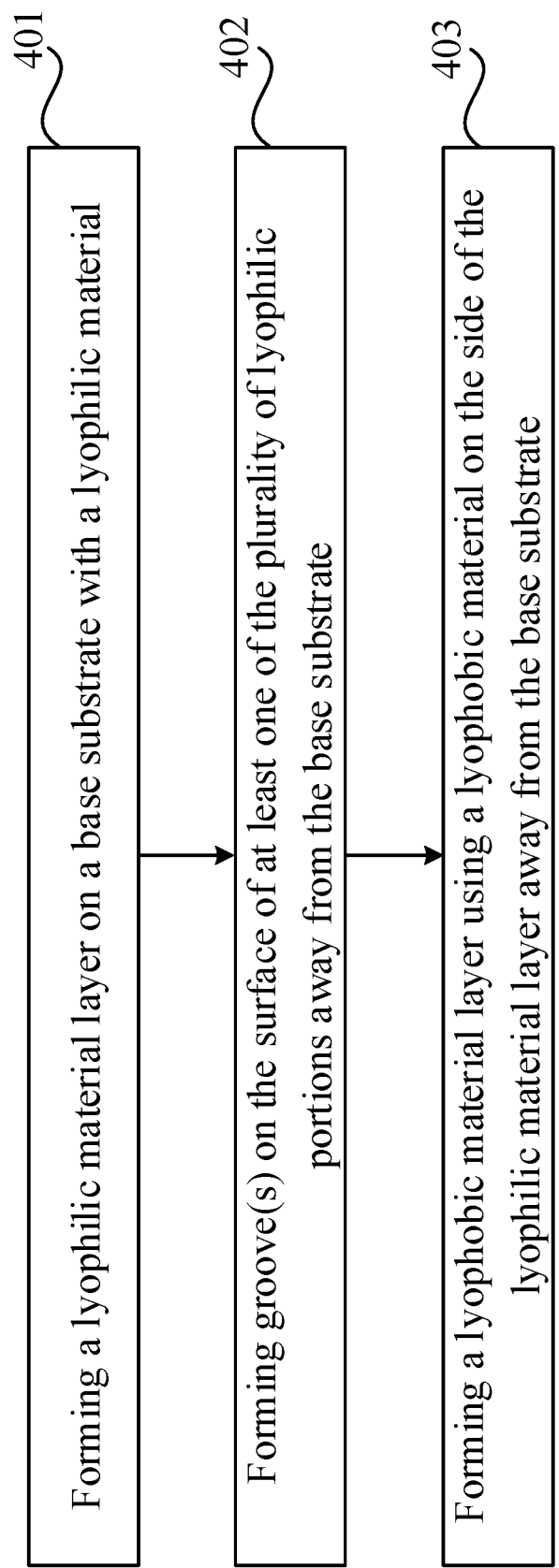
FIG. 5 is a flow chart of another manufacturing method for a pixel definition layer according to an embodiment of the present disclosure.

FIG. 5 shows a flow chart of a manufacturing method for a pixel definition layer according to an embodiment of the present disclosure. As shown in FIG. 5, the method may include following working processes.

In step 401, a lyophilic material layer is formed on a base substrate using a lyophilic material.

Generally, a first electrode may also be formed on the base substrate. The first electrode may be an anode or a cathode, which is not limited in the embodiments of the present disclosure.

Figure 6:
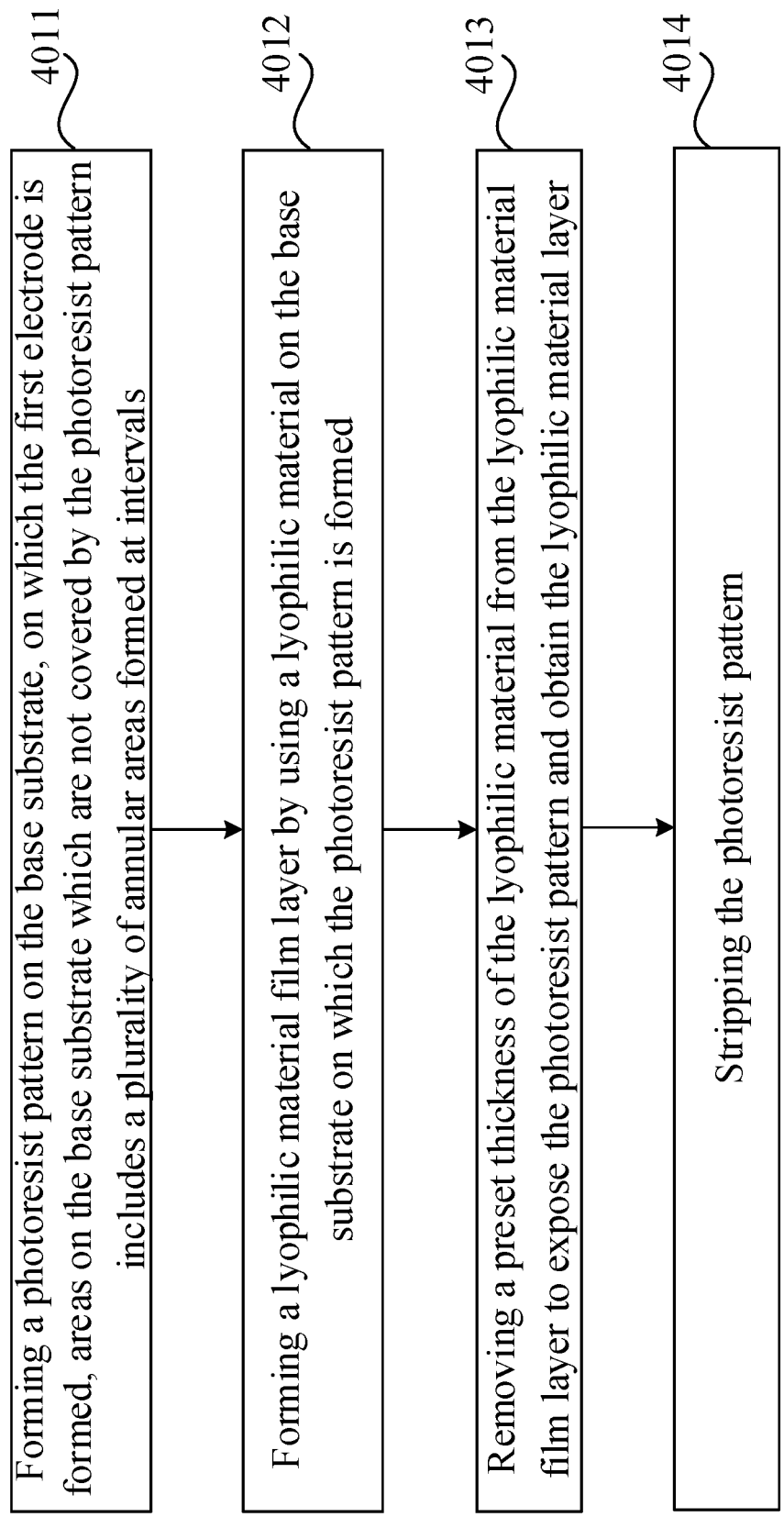
FIG. 6 is a flow chart of a method for forming a lyophilic material layer with a lyophilic material on a base substrate according to an embodiment of the present disclosure.

FIG. 6 shows a flow chart of a method for forming a lyophilic material layer by using a lyophilic material on a base substrate according to an embodiment of the present disclosure. As shown in FIG. 6, the process of forming the lyophilic material layer by using a lyophilic material on a base substrate may include following steps.

In step 4011, a photoresist pattern is formed on the base substrate, on which the first electrode is formed, areas on the base substrate which are not covered by the photoresist pattern includes a plurality of annular areas formed at intervals.

When forming the lyophilic material layer on the base substrate on which the first electrode is formed, in order to ensure that the shape of the first electrode (especially the surface structure of the first electrode) is not affected by the process of forming the lyophilic material layer, a photoresist pattern needs to be first formed on the base substrate, to protect the first electrode on the base substrate by the photoresist pattern. Then, the lyophilic material layer is formed in areas where no photoresist pattern is formed.

Optionally, the process of forming the photoresist pattern on the base substrate on which the first electrode is formed may include: photoresist coating, exposing, and developing. The areas on the base substrate which are not covered by the photoresist pattern include a plurality of annular areas formed at intervals. The material of the photoresist pattern may be any one of positive photoresist materials, such as fluorinated polyimide, fluorinated polymethyl methacrylate, polysiloxan, etc. The thickness of the photoresist pattern may be adjusted based on actual demands.

Figure 7:
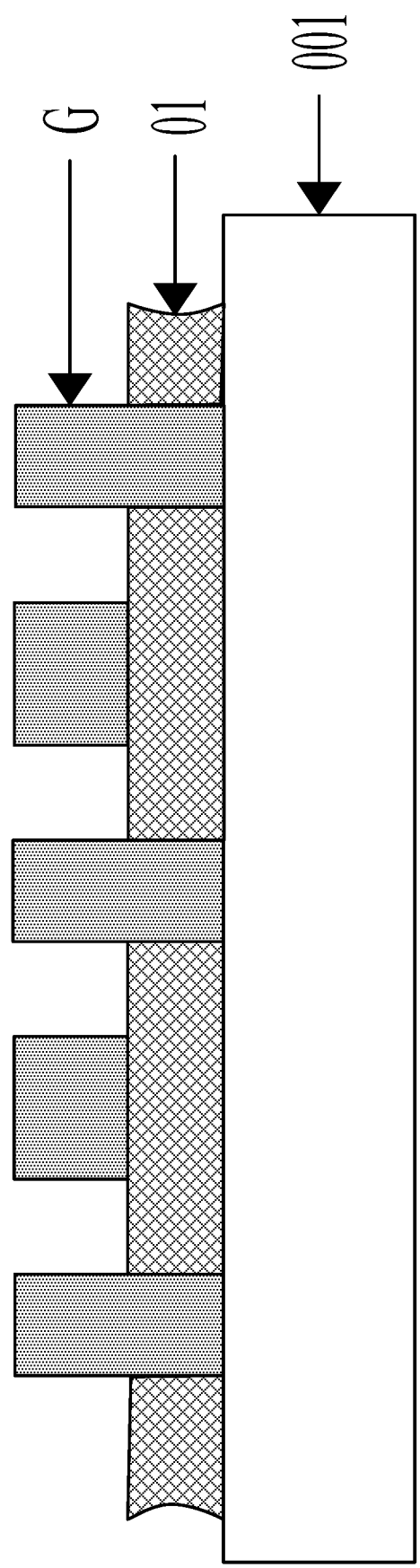
FIG. 7 is a schematic diagram of a structure of a base substrate formed with an anode after a photoresist pattern is formed according to an embodiment of the present disclosure.
Figure 8:
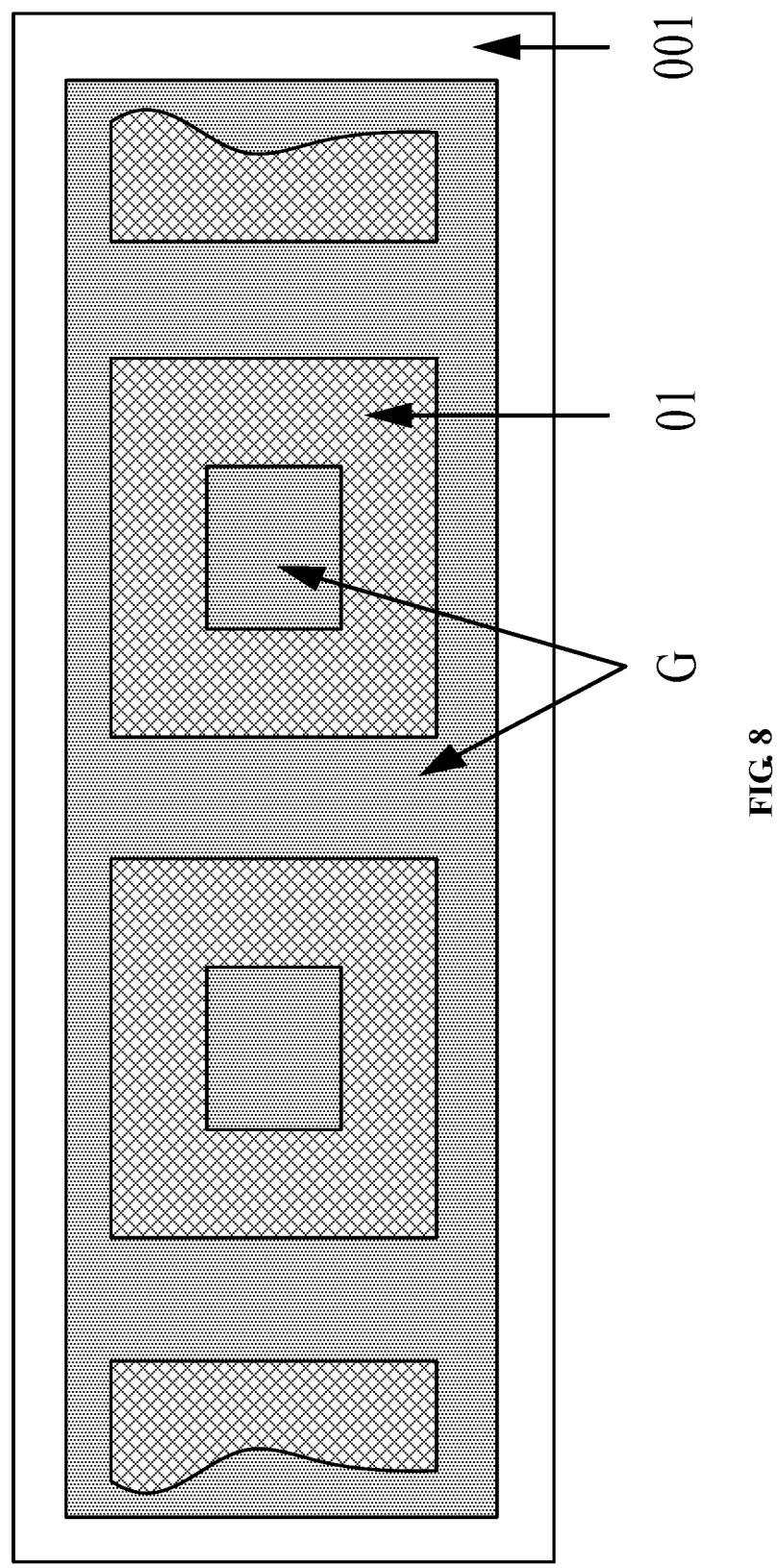
FIG. 8 is a top view of a photoresist pattern on a base substrate according to an embodiment of the present disclosure.

Exemplarily, please refer to FIG. 7, it shows a schematic diagram of a structure of a base substrate 001 formed with a first electrode 01 after a photoresist pattern G is formed according to an embodiment of the present disclosure. The top view of the photoresist pattern G on the base substrate 001 may be referred to FIG. 8. It can be seen from FIG. 8 that areas on the base substrate 001 which are not covered by the photoresist pattern G include a plurality of annular areas formed at intervals.

In step 4012, a lyophilic material film layer is formed by using a lyophilic material on the base substrate on which the photoresist pattern is formed.

Optionally, the lyophilic material film layer is obtained by depositing a layer of lyophilic material with a certain thickness through magnetron sputtering, thermal evaporation, Plasma Enhanced Chemical Vapor Deposition (PECVD), etc., on the base substrate on which the photoresist pattern is formed. Herein, the lyophilic material may be any one of inorganic lyophilic materials, such as silicon dioxide, silicon nitride, ITO, etc., and the thickness of the lyophilic material film layer may be set based on actual demands. For example, the thickness of the lyophilic material film layer may be greater than 600 nm.

Figure 9:
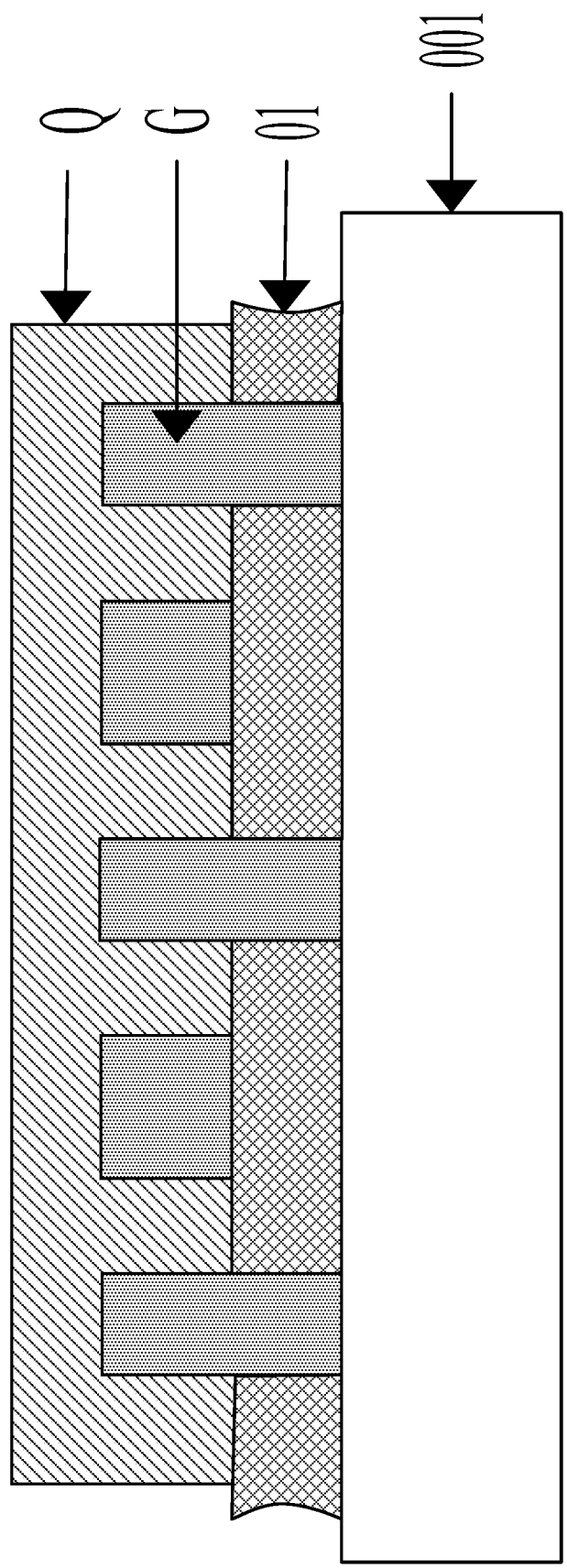
FIG. 9 is a schematic diagram of a structure of a base substrate formed with a photoresist pattern after a lyophilic material film layer is formed according to an embodiment of the present disclosure.

Exemplarily, please refer to FIG. 9, it shows a schematic diagram of a structure of a base substrate 001 formed with a photoresist pattern G after a lyophilic material film layer Q is formed according to an embodiment of the present disclosure.

Refer back to FIG. 6, in step 4013, a preset thickness of the lyophilic material is removed from the lyophilic material film layer to expose the photoresist pattern and obtain the lyophilic material layer.

Optionally, the lyophilic material film layer may be processed through etching and other technologies, to remove a certain thickness of the lyophilic material from the lyophilic material film layer, to expose the photoresist pattern and obtain the lyophilic material layer formed on the base substrate. The lyophilic material layer obtained may include a plurality of lyophilic portions of which each two are spaced. Each of the lyophilic portions is with an annular structure and is used to define a pixel region. Moreover, the thickness of the obtained lyophilic material layer may range from 300 nm to 600 nm. In practice, the thickness may be set based on demands.

Figure 10:
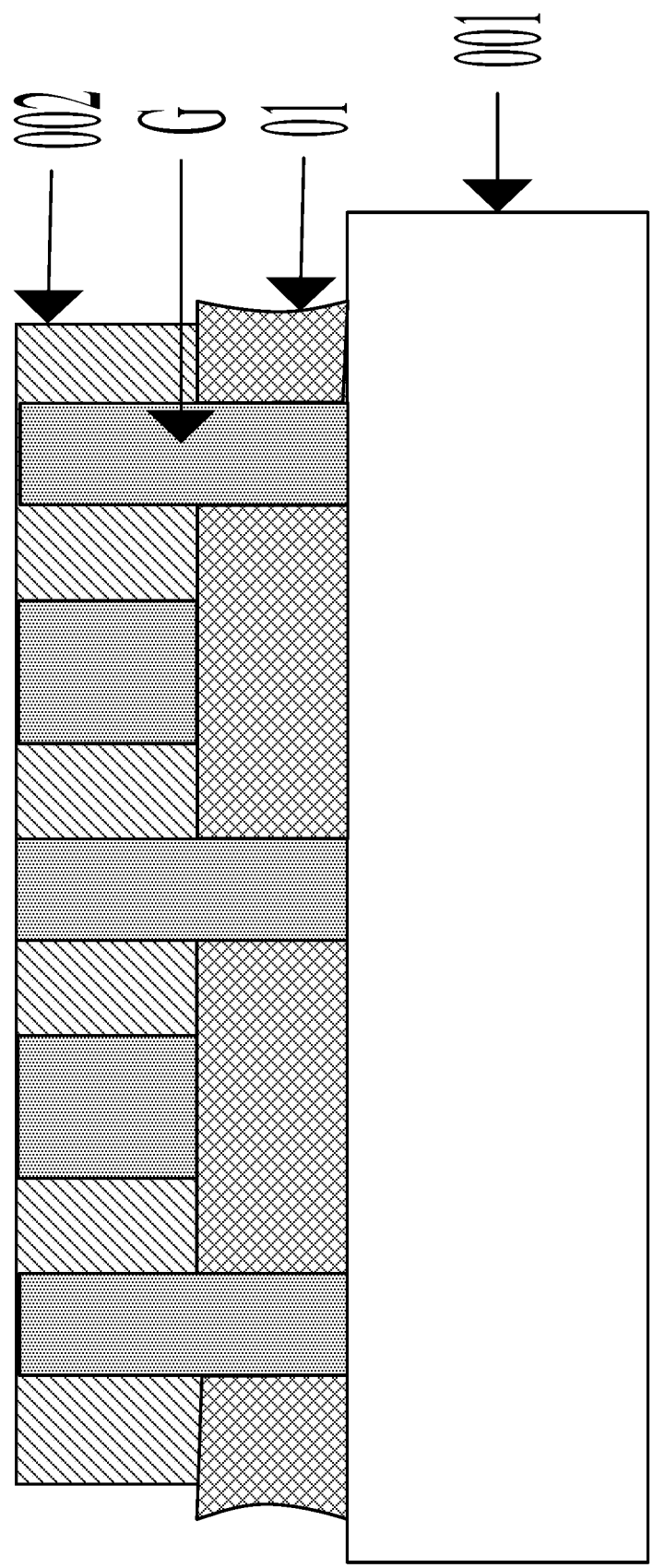
FIG. 10 is a schematic diagram of a structure of a base substrate after a photoresist pattern G is exposed and a lyophilic material layer is obtained according to an embodiment of the present disclosure.

Exemplarily, please refer to FIG. 10, it shows a schematic diagram of a structure of the base substrate after a photoresist pattern G is exposed and a lyophilic material layer 002 is obtained according to an embodiment of the present disclosure.

Refer back to FIG. 6, in step 4014, the photoresist pattern is stripped.

Figure 11:
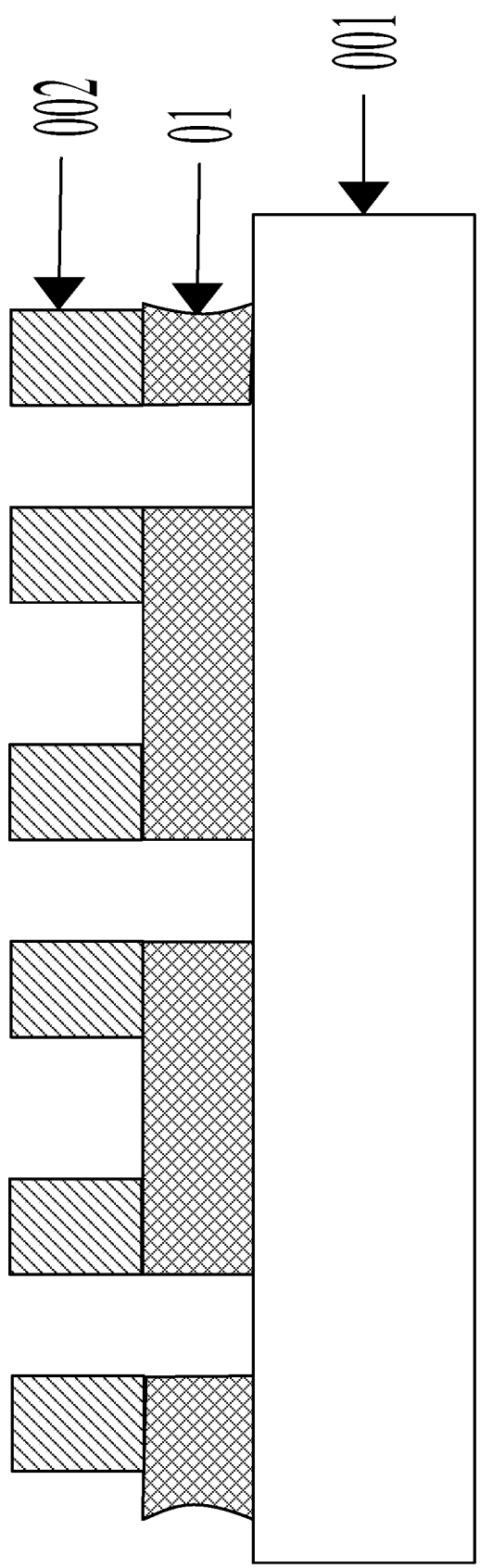
FIG. 11 is a schematic diagram of a structure of a base substrate after a photoresist pattern is stripped according to an embodiment of the present disclosure.

After the lyophilic material layer is obtained, the photoresist pattern may be stripped, to expose the first electrode formed on the base substrate. Exemplarily, please refer to FIG. 11, it shows a schematic diagram of a structure of the base substrate after a photoresist pattern is stripped according to an embodiment of the present disclosure.

During the process of forming the lyophilic material layer, since a photoresist pattern is coated on the first electrode before the lyophilic material layer is formed, the first electrode will not be damaged when the lyophilic material film layer is processed through etching, etc., thereby protecting the shape of the first electrode (especially the surface structure of the first electrode) and ensuring that the performance of the first electrode is not affected.

Refer back to FIG. 5, in step 402, groove(s) are formed on the surface of at least one of the plurality of lyophilic portions away from the base substrate.

Optionally, via holes may be formed through laser boring on the surface of at least one of the plurality of lyophilic portions away from the base substrate. And, when the via holes are formed through laser boring, the uniformity of the laser energy is not limited as long as via holes may be formed on the surface of at least one of the plurality of lyophilic portions away from the base substrate. Therefore, forming the via holes through this method has the characteristic that the manufacturing process is simple.

Alternatively, via holes may also be formed on the surface of at least one of the plurality of lyophilic portions away from the base substrate through patterning (for example, a one-time patterning process). The one-time patterning process may include photoresist coating, exposing, developing, etching and photoresist stripping. Herein, the etching method may be wet etching, dry etching, Reactive Ion Etching (RIE), etc.

Figure 12:
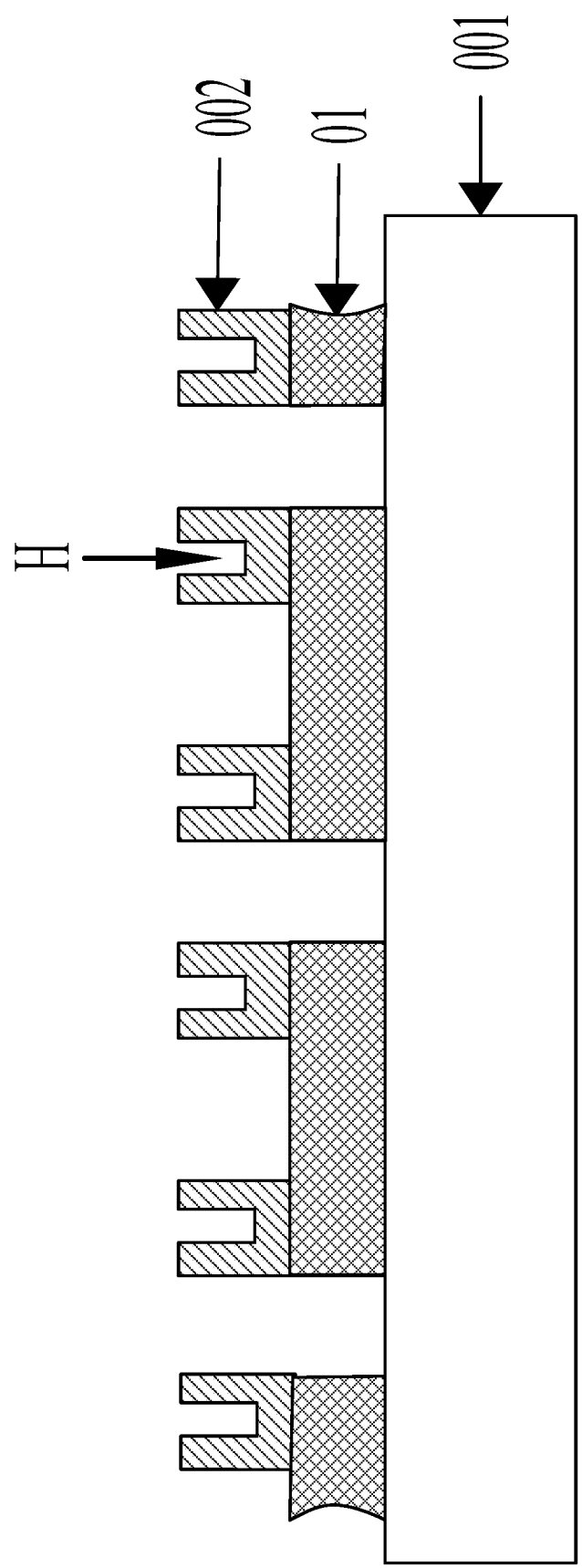
FIG. 12 is a schematic diagram of a structure of a base substrate after groove(s) are formed in a surface of at least one of a plurality of lyophilic portions away from the base substrate according to an embodiment of the present disclosure.

Exemplarily, please refer to FIG. 12, it shows a schematic diagram of a structure of a base substrate after groove(s) H are formed in a surface of at least one of a plurality of lyophilic portions away from the base substrate according to an embodiment of the present disclosure.

During the process of forming the lyophobic material layer on the side of the lyophilic material layer away from the base substrate, the groove(s) formed may play a certain limiting function on the lyophobic material formed in the groove(s) such that the lyophobic material layer 003 is formed at the preset position more accurately. Moreover, after the lyophobic material layer is formed, the groove(s) may further fix the formed lyophobic material layer to a certain degree, to ensure that stability of the structure of the pixel definition layer, to achieve a better limiting function during the process of forming films in the pixel regions, and to further improve the uniformity of films formed in the pixel regions by the solution.

Refer back to FIG. 5, in step 403, a lyophobic material layer is formed using a lyophobic material on the side of the lyophilic material layer away from the base substrate.

A layer of lyophobic material with a certain thickness may be coated on the base substrate to obtain the lyophobic material film layer. Then, the lyophobic material film layer may be exposed, developed, toasted, etc., to obtain the lyophobic material layer with a certain pattern. Herein, the lyophobic material may be any one of organic lyophobic materials, such as fluorinated polyimide, fluorinated polymethyl methacrylate, polysiloxane, etc., and the thickness of the lyophobic material layer may be set based on actual demands. For example, the thickness of the lyophobic material layer range from 500 nm to 900 nm.

The lyophobic material layer formed is filled between each two adjacent lyophilic portions of the plurality of lyophilic portions, and the distance from the surface of the lyophobic material layer away from the base substrate to the base substrate is larger than the distance from the surface of the lyophilic material layer away from the base substrate to the base substrate. That is, the distance from the surface of the lyophobic material layer away from the base substrate to the base substrate is larger than the thickness of the lyophilic material layer, such that the solution may be restrained from climbing on the side surface of the pixel definition layer by taking advantage of the repellency of the lyophobic material layer to the solution.

The orthographic projection of the first surface of the lyophobic material layer on the base substrate is within the orthographic projection of the surface of the lyophilic material layer away from the base substrate on the base substrate. Meanwhile, the orthographic projection(s) of the groove(s) on the base substrate are within the orthographic projection of the first surface of the lyophobic material layer on the base substrate.

Figure 13:
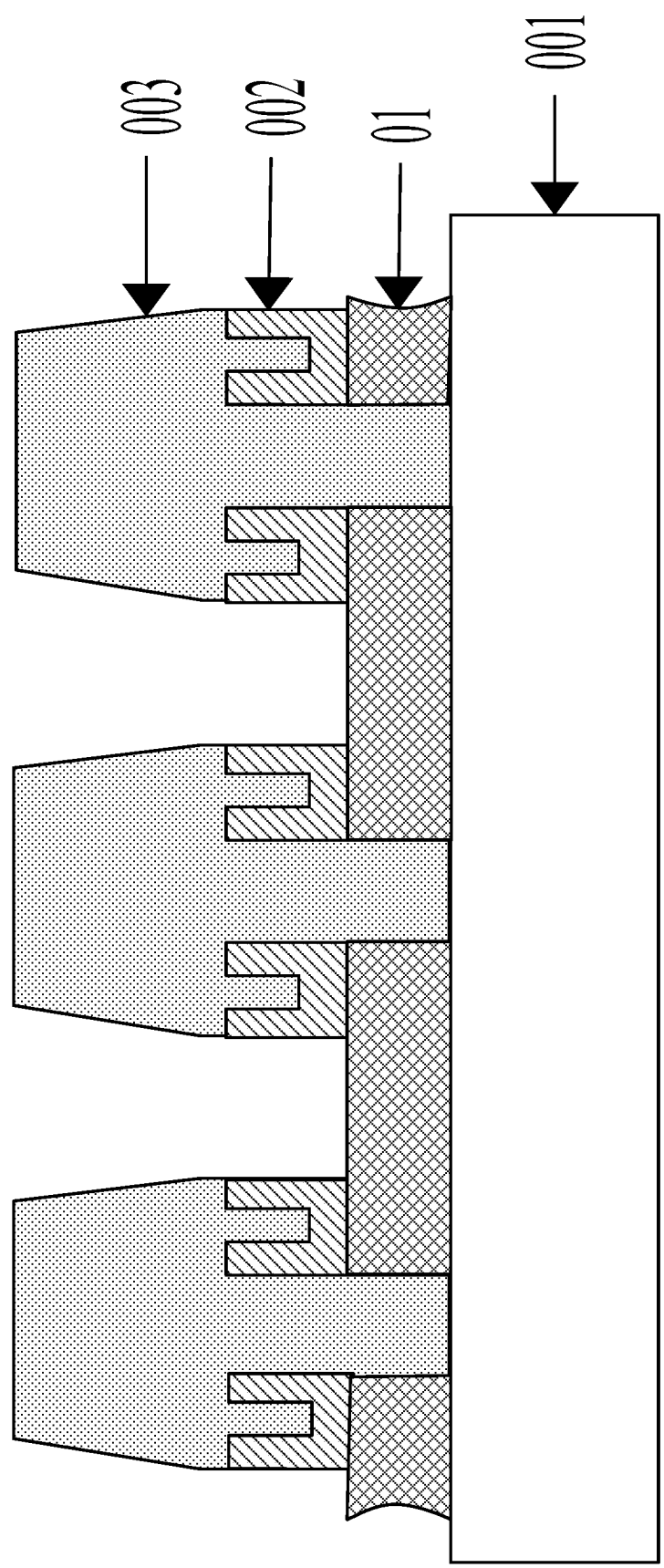
FIG. 13 is a schematic diagram of a structure of a base substrate after a lyophobic material layer is formed on a side of the lyophilic material layer away from the base substrate according to an embodiment of the present disclosure.

Exemplarily, please refer to FIG. 13, it shows a schematic diagram of a structure of the base substrate after a lyophobic material layer 003 is formed on the side of the lyophilic material layer 002 away from the base substrate 001 according to an embodiment of the present disclosure.

Continue to refer to FIG. 5, in the method shown in FIG. 5, step 402 may be executed or not based on actual demands. When step 402 is not executed, the surface away from the base substrate, of the lyophilic portion formed in the pixel definition layer is not provided with groove(s), and the surface of the lyophilic portion away from the base substrate is a plane. Correspondingly, the first surface of the lyophobic material layer is also a plane. The surface is a plane under ideal conditions. However, in practice, there may be tiny bulges or dents on the surface due to process variation or other factors. In such cases, the surface may also be deemed as a plane. When step 402 is executed, the surface away from the base substrate, of the lyophilic portion formed in the pixel definition layer is provided with groove(s), and the first surface of the lyophobic material layer includes a plurality of bulges facing towards the base substrate, and the bulged positions correspond to the grooves one by one.

In summary, with manufacturing method for the pixel definition layer provided in the embodiments of the present disclosure, by disposing the lyophilic material layer and the lyophobic material layer laminated on the base substrate, the distance from the surface of the lyophobic material layer away from the base substrate to the base substrate is larger than the distance from the surface of the lyophilic material layer away from the base substrate to the base substrate, thereby ensuring that the solution flows into the pixel regions by taking advantage of the attractivity of the lyophilic material layer to the solution, and restraining the solution from climbing on the pixel definition layer by taking advantage of the repellency of the lyophobic material layer to the solution. Moreover, the lyophilic material layer includes a plurality of lyophilic portions. During the process of forming the lyophobic material layer, adjacent two lyophilic portions may limit the flow range of the lyophobic material, which ensure the stability of the structure of the pixel definition layer, thereby effectively improving the uniformity of films formed by the solution in the pixel regions.

It should be noted that the order of steps in the manufacturing method for a pixel definition layer provided in the embodiments of the present disclosure may be adjusted appropriately, and the steps may be added or deleted correspondingly. For example, step 402 may be not executed.

Figure 14:
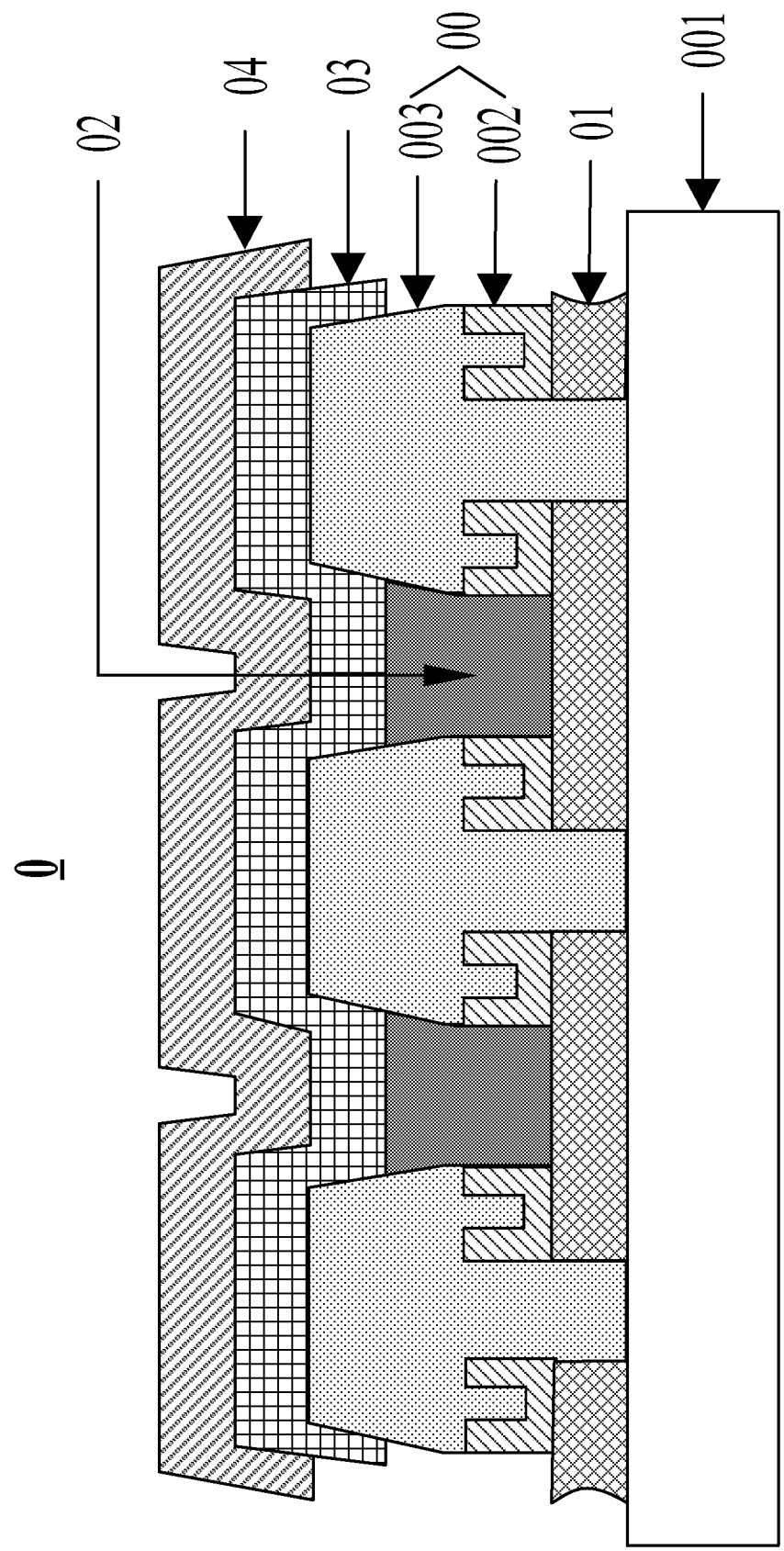
FIG. 14 is a schematic diagram of a structure of a display substrate according to an embodiment of the present disclosure.

FIG. 14 shows a schematic diagram of a structure of a display substrate according to an embodiment of the present disclosure. The display substrate may include: a base substrate, a pixel definition layer on the base substrate, and a first electrode between the base substrate and the pixel definition layer. The pixel definition layer may be the pixel definition layer shown in any one of FIG. 1, FIG. 2, FIG. 3 and FIG. 13. Herein, the thickness of the first electrode may be 70 nm.

Optionally, the first electrode and the lyophilic material layer in the pixel definition layer are made of the same material. For example, both the first electrode and the lyophilic material layer may be made of ITO. When the first electrode and the lyophilic material layer are made of the same material, an effective contact between the first electrode and the lyophilic material layer may be guaranteed. Moreover, compared to the related art in which the two are made of different materials, separation between the first electrode and the lyophilic material layer due to the different materials may be avoided, thereby ensuring the normal use of the display substrate.

As shown in FIG. 14, the display substrate 0 may further include an organic light-emitting layer 02 on a side of the first electrode 01 away from the base substrate 001, a barrier film 03 on a side of the organic light-emitting layer 02 away from the base substrate 001; and a second electrode 04 on a side of the barrier film 03 away from the base substrate 001. Herein, the second electrode 04 is a cathode when the first electrode 01 is an anode, and the second electrode 04 is an anode when the first electrode 01 is a cathode.

The organic light-emitting layer 02 may at least include an electroluminescent material layer, a hole injection layer and an electron injection layer. Holes in the hole injection layer and electrons in the electron injection layer may move to the electroluminescent material layer and combine under the driving of voltage, thereby enabling the electroluminescent material layer to emit light.

The barrier film 03 may be made of materials such as molybdenum oxide, zinc oxide, titanium oxide, etc., and the thickness thereof may range from 100 nm to 300 nm. The barrier film 03 is used to separate the first electrode 01 from the second electrode 04, to avoid the risk of short circuit due to the contact between the first electrode 01 and the second electrode 04 caused by technological problem and others, thereby ensuring the normal use of the display substrate 0. Moreover, when a voltage is applied to the second electrode 04 and the first electrode 01, the barrier film 03 does not affect the movement of the holes and electrons in the organic light-emitting layer 02. Thus, the holes and electrons may still move to the electroluminescent material layer and combine under the driving of voltage, thereby enabling the electroluminescent material layer to emit light.

When the lyophilic material layer 002 and the first electrode 01 are made of the same material, in order to further ensure that the second electrode 04 cannot electrically contact with the material for manufacturing the lyophilic material layer 002 and the first electrode 01, the distance from the surface away from the base substrate 001, of the lyophilic material layer in the pixel definition layer to the base substrate 001 may be shorter than the distance from the surface of the organic light-emitting layer 02 away from the base substrate 001 to the base substrate 001, thereby ensuring a certain vertical distance between the surface of the lyophilic material layer away from the base substrate 001 and the surface of the second electrode 04 to the base substrate.

In summary, in the display substrate provided in the embodiments of the present disclosure, the pixel definition layer includes a lyophilic material layer and a lyophobic material layer sequentially laminated on the base substrate. The distance from the surface of the lyophobic material layer away from the base substrate to the base substrate is larger than the distance from the surface of the lyophilic material layer away from the base substrate to the base substrate, thereby ensuring that the solution flows into the pixel regions by taking advantage of the attractivity of the lyophilic material layer to the solution, and restraining the solution from climbing on the pixel definition layer by taking advantage of the repellency of the lyophobic material layer to the solution. Moreover, the lyophilic material layer includes a plurality of lyophilic portions, and the lyophobic material layer is filled between each two adjacent lyophilic portions of the plurality of lyophilic portions, which ensures the stability of the structure of the pixel definition layer, thereby effectively improving the uniformity of films formed by the solution in the pixel regions.

Figure 15:
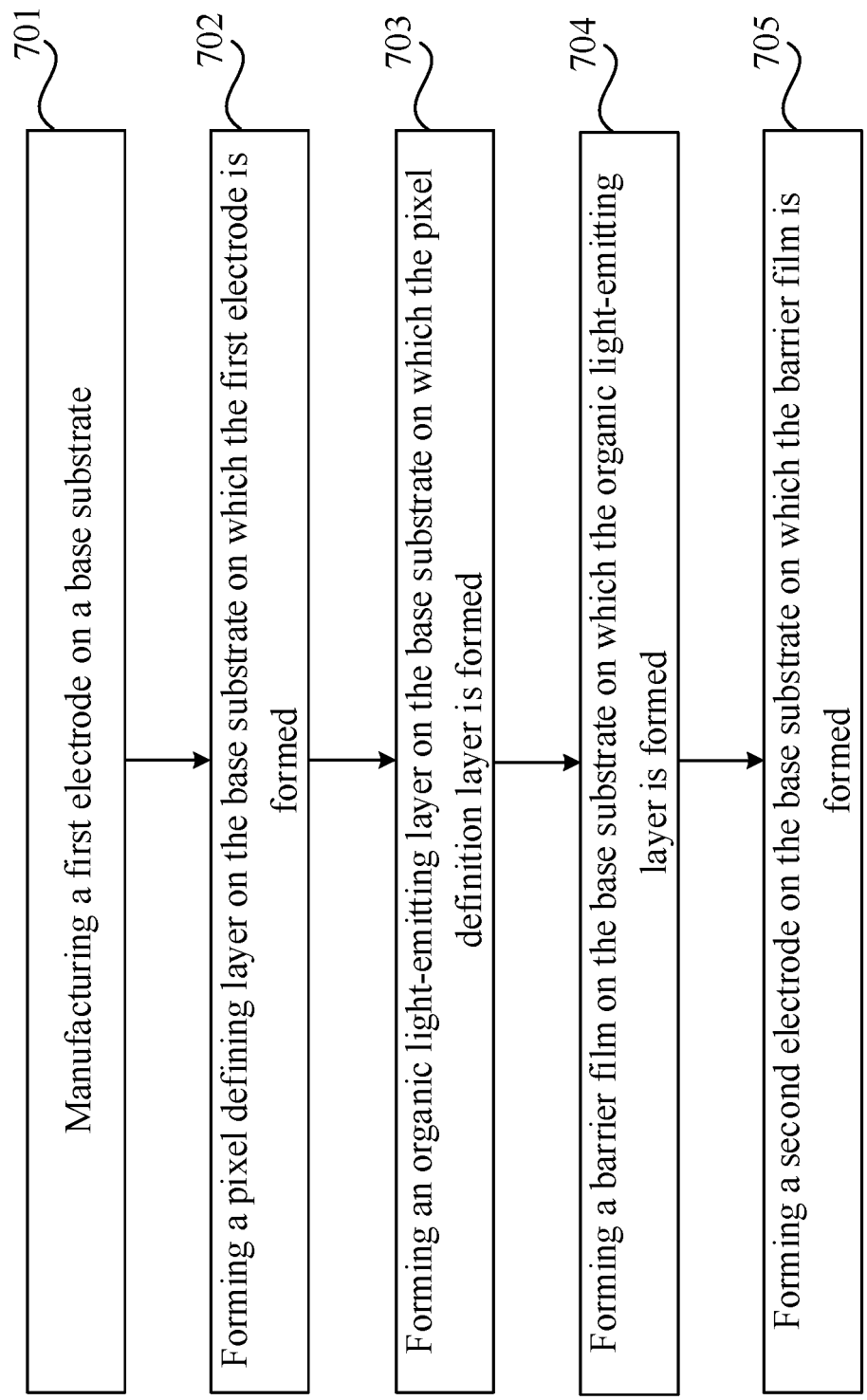
FIG. 15 is a flow chart of a manufacturing method for a display substrate according to an embodiment of the present disclosure.

FIG. 15 shows a flow chart of a manufacturing method for a display substrate according to an embodiment of the present disclosure. As shown in FIG. 15, the method may include following working processes.

In step 701, a first electrode is manufactured on a base substrate.

An electrode layer is obtained by depositing a layer of electrode materials with a certain thickness on the base substrate through magnetron sputtering, thermal evaporation, PECVD, etc. Then, the electrode layer may be processed through a one-time pattering process and the first electrode is obtained. Herein, the thickness of the first electrode may be set based on actual demands. For example, when the first electrode is an anode, the electrode material may be ITO and the thickness may be 70 nm.

In step 702, a pixel definition layer is formed on the base substrate on which the first electrode is formed.

Herein, the method for forming the pixel definition layer may be referred to the method for manufacturing the pixel definition layer in the embodiments of the present disclosure, and is not repeated herein.

In step 703, an organic light-emitting layer is formed on the base substrate on which the pixel definition layer is formed.

The organic light-emitting layer is formed in the pixel region defined by the pixel definition layer, and the organic light-emitting layer may at least include: an electroluminescent material layer, a hole injection layer and an electron injection layer. Herein, the method for forming the organic light-emitting layer is not repeated herein.

In step 704, a barrier film is formed on the base substrate on which the organic light-emitting layer is formed.

A barrier film layer is obtained by depositing a layer of barrier film materials with a certain thickness on the base substrate on which the organic light-emitting layer is formed through magnetron sputtering, thermal evaporation, PECVD, etc. Then, the barrier film is obtained by processing the barrier film layer through a one-time pattering process. The barrier film may be made of molybdenum oxide, zinc oxide, titanium oxide, etc., and the thickness may be set based on actual demands. For example, the thickness of the barrier film may range from 100 nm to 300 nm. The barrier film is used to separate the first electrode from the second electrode, to avoid the risk of short circuit due to the contact between the first electrode 01 and the second electrode 04 caused by technological problem and others.

In step 705, a second electrode is formed on the base substrate on which the barrier film is formed.

In summary, with the method for manufacturing the display substrate provided in the embodiments of the present disclosure, the pixel definition layer in the manufactured display substrate includes a lyophilic material layer and a lyophobic material layer sequentially laminated on the base substrate. The distance from the surface of the lyophobic material layer away from the base substrate to the base substrate is larger than the distance from the surface of the lyophilic material layer away from the base substrate to the base substrate, thereby ensuring that the solution flows into the pixel regions by taking advantage of the attractivity of the lyophilic material layer to the solution, and restraining the solution from climbing on the pixel definition layer by taking advantage of the repellency of the lyophobic material layer to the solution. Moreover, the lyophobic material layer is filled between each two adjacent lyophilic portions of the plurality of lyophilic portions, which ensures the stability of the structure of the pixel definition layer, thereby effectively improving the uniformity of films formed by the solution in the pixel regions.

There is further provided a display panel, including the above-mentioned display substrate in the embodiments of the present disclosure. The display panel may be any product or part with a display function, such as a liquid crystal panel, an electronic paper, a mobile phone, a tablet computer, a TV, a display, a laptop computer, a digital photo frame, a navigator, etc. Exemplarily, the display panel may be an OLED display panel. For example, the display panel may be an active matrix organic light emitting diode (AMOLED) display panel driven by constant current.

The foregoing descriptions are only exemplary embodiments of the present disclosure, and are not intended to limit the present disclosure. Within the spirit and principles of the present disclosure, any modifications, equivalent substitutions, improvements, etc., are within the protection scope of the appended claims of the present disclosure.

The invention claimed is:

1. A pixel defining layer, comprising:
    a lyophilic material layer on a base substrate, wherein the lyophilic material layer comprises a plurality of lyophilic portions that are spaced in pairs, each of the lyophilic portions being an annular structure and being used to define a pixel region; and
    a lyophobic material layer on a side of the lyophilic material layer away from the base substrate, wherein the lyophobic material layer fills between each two adjacent lyophilic portions of the plurality of lyophilic portions, and a distance from a surface of the lyophobic material layer away from the base substrate to the base substrate is larger than a distance from a surface of the lyophilic material layer away from the base substrate to the base substrate; and
    wherein the lyophilic material layer is made of a lyophilic material which is a conductive material.

2. The pixel defining layer according to claim 1, wherein an orthographic projection of a first surface of the lyophobic material layer on the base substrate is within an orthographic projection of the surface of the lyophilic material layer away from the base substrate on the base substrate, the first surface being a surface of the lyophobic material layer that is in contact with the surface of the lyophilic material layer away from the base substrate.

3. The pixel defining layer according to claim 2, wherein a surface of at least one of the plurality of lyophilic portions away from the base substrate is provided with a groove; and
    an orthographic projection of the groove on the base substrate is within the orthographic projection of the first surface on the base substrate.

4. The pixel defining layer according to claim 1, wherein the lyophilic portion is a square annular structure.

5. The pixel defining layer according to claim 1, wherein the lyophilic material layer is made of a lyophilic material and the lyophobic material layer is made of a lyophobic material;
    the lyophobic material includes: fluorinated polyimide, fluorinated polymethyl methacrylate or polysiloxane; and
    the lyophilic material includes: silicon dioxide, silicon nitride or indium tin oxide.

6. The pixel defining layer according to claim 1, wherein a thickness range of the lyophilic material layer is: 300 nm to 600 nm; and
    a thickness range of the lyophobic material layer is: 500 nm to 900 nm.

7. A manufacturing method for a pixel defining layer, comprising:
    forming a lyophilic material layer on a base substrate with a lyophilic material, wherein the lyophilic material layer comprises a plurality of lyophilic portions that are spaced in pairs, each of the lyophilic portions being an annular structure and being used to define a pixel region; and
    forming a lyophobic material layer on a side of the lyophilic material layer away from the base substrate with a lyophobic material, wherein the lyophobic material layer fills between each two adjacent lyophilic portions of the plurality of lyophilic portions, and a distance from a surface of the lyophobic material layer away from the base substrate to the base substrate is larger than a distance from a surface of the lyophilic material layer away from the base substrate to the base substrate; and wherein the lyophilic material layer is made of a lyophilic material which is a conductive material.

8. The method according to claim 7, wherein an orthographic projection of a first surface of the lyophobic material layer on the base substrate is within an orthographic projection of the surface of the lyophilic material layer away from the base substrate on the base substrate, the first surface being a surface of the lyophobic material layer that is in contact with the surface of the lyophilic material layer away from the base substrate.

9. The method according to claim 8, wherein before said forming a lyophobic material layer on a side of the lyophilic material layer away from the base substrate with a lyophobic material, the method further comprises:
forming a groove on a surface of at least one of the plurality of lyophilic portions away from the base substrate;
an orthographic projection of the groove on the base substrate being within the orthographic projection of the first surface on the base substrate.

10. The method according to claim 9, wherein said forming a groove on a surface of at least one of the plurality of lyophilic portions away from the base substrate comprises:
forming the groove on the surface of at least one of the plurality of lyophilic portions away from the base substrate through laser boring or patterning.

11. The method according to claim 7, wherein a first electrode is formed on the base substrate, and said forming a lyophilic material layer on a base substrate with a lyophilic material comprises:
forming a photoresist pattern on the base substrate on which the first electrode is formed, areas which are not covered by the photoresist pattern on the base substrate including a plurality of annular areas formed at intervals,
forming a lyophilic material film layer on the base substrate on which the photoresist pattern is formed with a lyophilic material;
removing a preset thickness of the lyophilic material from the lyophilic material film layer to expose the photoresist pattern and obtain the lyophilic material layer; and
stripping the photoresist pattern.

12. A display substrate, comprising: a base substrate, a pixel defining layer on the base substrate, and a first electrode between the base substrate and the pixel defining layer, wherein the pixel defining layer comprises:
a lyophilic material layer on the base substrate, wherein the lyophilic material layer comprises a plurality of lyophilic portions that are spaced in pairs, each of the lyophilic portions being an annular structure and being used to define a pixel region; and
a lyophobic material layer on a side of the lyophilic material layer away from the base substrate, wherein the lyophobic material layer fills between each two adjacent lyophilic portions of the plurality of lyophilic portions, and a distance from a surface of the lyophobic material layer away from the base substrate to the base substrate is larger than a distance from a surface of the lyophilic material layer away from the base substrate to the base substrate; and
wherein the first electrode and the lyophilic material layer in the pixel defining layer are made of the same material.

13. The display substrate according to claim 12, further comprising:
an organic light-emitting layer on a side of the first electrode away from the base substrate;
a barrier film on a side of the organic light-emitting layer away from the base substrate; and
a second electrode on a side of the barrier film away from the base substrate;
wherein, the barrier film is used to separate the first electrode from the second electrode.

14. The display substrate according to claim 13, wherein the distance from the surface of the lyophilic material layer away from the base substrate to the base substrate is shorter than a distance from a surface of the organic light-emitting layer away from the base substrate to the base substrate.

15. The display substrate according to claim 14, wherein materials for forming the barrier film include: molybdenum oxide, zinc oxide or titanium oxide.

16. The display substrate according to claim 14, wherein a thickness range of the barrier film is: 100 nm to 300 nm.

17. A display panel, comprising the display substrate according to claim 12.

18. The display panel according to claim 17, further comprising: an active matrix organic light-emitting diode display panel.

* * * * *